(12) United States Patent
Roth et al.

(10) Patent No.: US 9,530,761 B2
(45) Date of Patent: Dec. 27, 2016

(54) PACKAGE SYSTEMS INCLUDING PASSIVE ELECTRICAL COMPONENTS

(75) Inventors: Alan Roth, Leander, TX (US); Eric Soenen, Austin, TX (US); Chaohao Wang, Stanford, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 777 days.

(21) Appl. No.: 13/597,973

(22) Filed: Aug. 29, 2012

(65) Prior Publication Data

US 2013/0058049 A1  Mar. 7, 2013

Related U.S. Application Data

(60) Provisional application No. 61/530,652, filed on Sep. 2, 2011.

(51) Int. Cl.
| | |
|---|---|
| *H05K 7/00* | (2006.01) |
| *H01L 25/16* | (2006.01) |
| *H05K 1/18* | (2006.01) |
| *H01L 23/00* | (2006.01) |

(52) U.S. Cl.
CPC .............. *H01L 25/16* (2013.01); *H05K 1/181* (2013.01); *H05K 1/185* (2013.01); *H01L 24/45* (2013.01); *H01L 24/48* (2013.01); *H01L 2224/32265* (2013.01); *H01L 2224/45111* (2013.01); *H01L 2224/45116* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48265* (2013.01); *H01L 2924/00014* (2013.01); *H01L 2924/01047* (2013.01); *H01L 2924/10252* (2013.01); *H01L 2924/10253* (2013.01); *H01L 2924/10271* (2013.01); *H01L 2924/10272* (2013.01); *H01L 2924/10329* (2013.01); *H01L 2924/10331* (2013.01); *H01L 2924/10332* (2013.01); *H01L 2924/10333* (2013.01); *H01L 2924/10335* (2013.01); *H01L 2924/10337* (2013.01); *H01L 2924/10339* (2013.01); *H01L 2924/10342* (2013.01); *H01L 2924/10351* (2013.01); *H01L 2924/19041* (2013.01); *H01L 2924/19042* (2013.01); *H01L 2924/19043* (2013.01);
(Continued)

(58) Field of Classification Search
CPC ...... H01L 2924/00; H01L 21/00; H01L 24/00; H01L 24/01; H01L 24/02; H01L 24/10; H01L 24/18; H01L 24/19; H01L 24/26; H01L 24/42
USPC .......................................... 361/760, 761–764
See application file for complete search history.

(56) References Cited

U.S. PATENT DOCUMENTS

| | | |
|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |

(Continued)

*Primary Examiner* — Tremesha S Willis
(74) *Attorney, Agent, or Firm* — Hauptman Ham, LLP (57) ABSTRACT

A package system includes at least one active circuitry disposed over a substrate. A passivation structure is disposed over the at least one active circuitry. The passivation structure has at least one opening that is configured to expose at least one first electrical pad. At least one passive electrical component is disposed over the passivation structure. The at least one passive electrical component is electrically coupled with the at least one first electrical pad.

20 Claims, 7 Drawing Sheets

(52) U.S. Cl.
CPC .............. *H01L 2924/19104* (2013.01); *H05K 2201/1003* (2013.01); *H05K 2201/10166* (2013.01); *Y02P 70/611* (2015.11)

(56) References Cited

U.S. PATENT DOCUMENTS

| | | | |
|---|---|---|---|
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,834,450 B2 | 11/2010 | Kang | |
| 2007/0076391 A1* | 4/2007 | Hsu | 361/763 |
| 2008/0047740 A1* | 2/2008 | Lien | H01L 23/50 174/256 |
| 2011/0169163 A1 | 7/2011 | Liou et al. | |
| 2012/0146209 A1* | 6/2012 | Hu et al. | 257/692 |

* cited by examiner

PACKAGE SYSTEMS INCLUDING PASSIVE ELECTRICAL COMPONENTS

CROSS-REFERENCE TO RELATED APPLICATION

The present application claims priority of U.S. Provisional Patent Application No. 61/530,652, filed on Sep. 2, 2011, which is incorporated herein by reference in its entirety.

TECHNICAL FIELD

The present disclosure relates generally to the field of semiconductor and, more particularly, to package systems including passive electrical components.

BACKGROUND

Portable devices, such as mobile phones, laptops, etc., are widely used, and are equipped with various functionalities. For example, mobile phones are used to place telephone calls, take photographs, access the Internet, send and receive email, check stock quotes and sports scores, as well as operate as a personal digital assistant (or PDA) and/or MP3 player.

BRIEF DESCRIPTION OF THE DRAWINGS

The present disclosure is understood from the following detailed description when read with the accompanying figures. It is noted that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Portable devices usually are powered by small batteries so as to be carried easily and lightly. The batteries are configured to provide a voltage level of around, e.g., 3.6 V, depending on the type of the portable device. To supply power to integrated circuits in the portable device, the battery voltage is regulated down to a small voltage, e.g., 1 V. In some techniques, a DC/DC converter which includes inductors is adopted to regulate the battery voltage.

A DC/DC converter that is known to the applicants includes a plurality of discrete inductors. To regulate the battery voltage, the inductors are bonded on a printed circuit board (PCB). The inductors are wired bonded with the PCB to electrically communicate with other circuitries that are also bonded on the PCB. Applicants found that the discrete inductors are expensive. Additionally, the discrete inductors are disposed on a certain area of the PCB, leaving large footprints on the PCB. Applicants also found that due to the wire bonding, the efficiency of the DC/DC converter may not reach a desired level.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1:
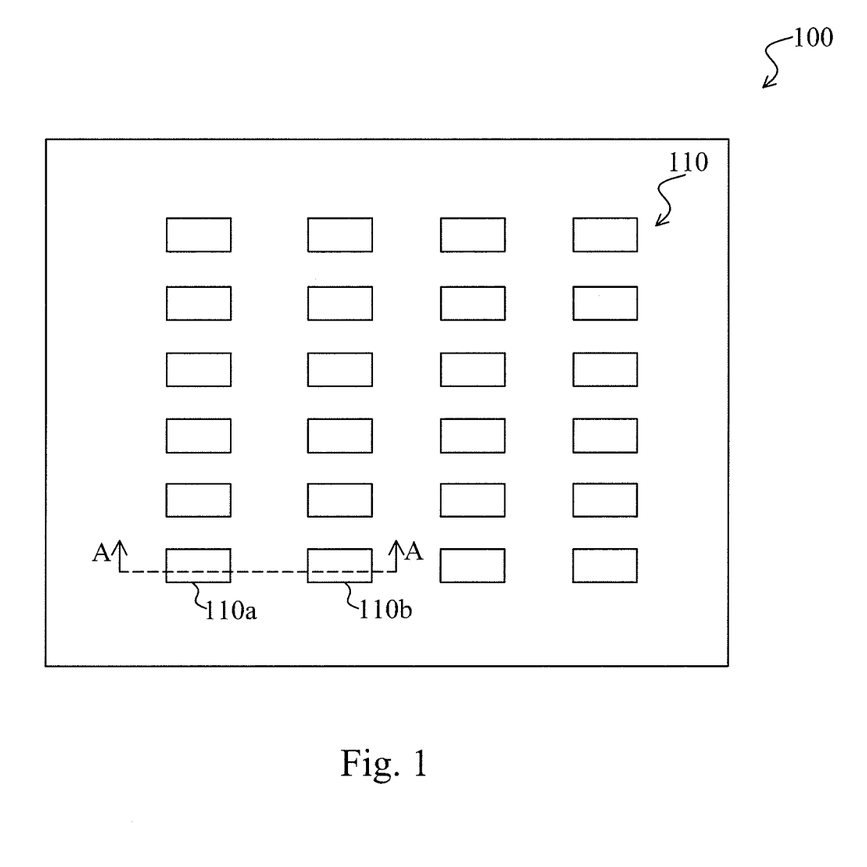
FIG. 1 is a schematic top view of an exemplary package system.

FIG. 1 is a schematic top view of an exemplary package system. In FIG. 1, a package system 100 includes a plurality of passive electrical components 110 that are disposed over a surface of a passivation structure (not labeled). In some embodiments, the passive electrical components 110 are arranged in an array fashion. In some embodiments, at least two of the passive electrical components 110 are electrically coupled to each other in a parallel or series fashion. In other embodiments, the passive electrical components 110 are electrically isolated from each other. The passive electrical components 110 each can be a capacitor, an inductor or a resistor.

Figure 2A:
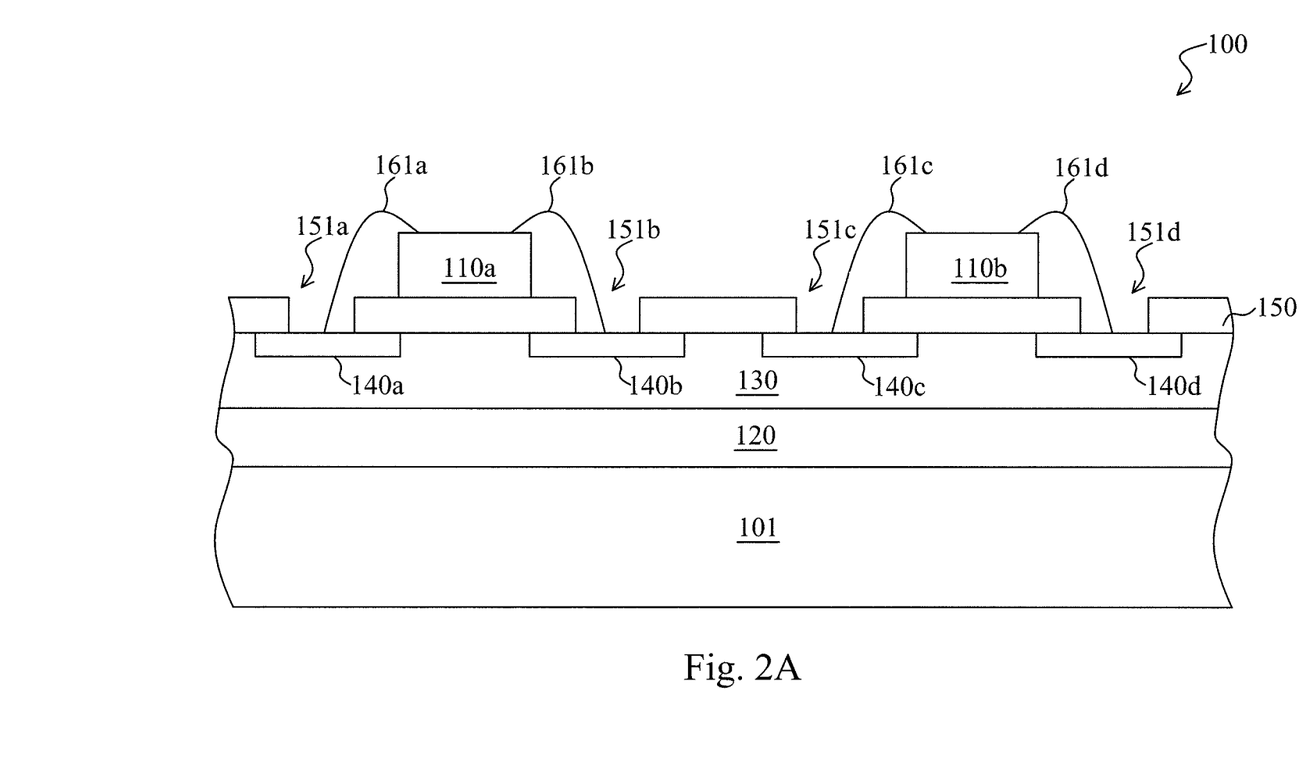
FIGS. 2A-2C are schematic cross-sectional views of various exemplary package systems taken along section line A-A of FIG. 1

FIG. 2A is a schematic cross-sectional view of a first exemplary package system taken along section line A-A of FIG. 1. In FIG. 2A, the package system 100 includes at least one active circuitry, e.g., an active circuitry 120 that is disposed over a substrate 101. In some embodiments, the active circuitry 120 includes at least one switch, at least one logic circuitry, at least one controller, at least one analog circuitry, at least one mixed-signal circuitry, at least one processor, other active circuitries, and/or any combinations thereof.

Figure 3A:
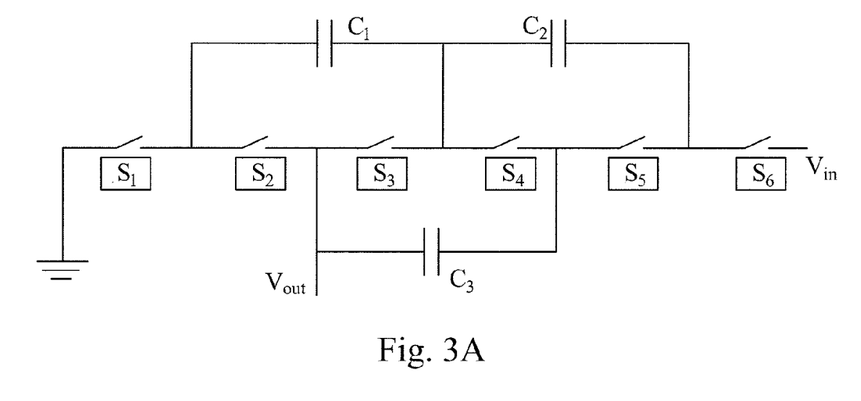
FIGS. 3A-3E are schematic drawings of various exemplary DC/DC converters.
Figure 3B:
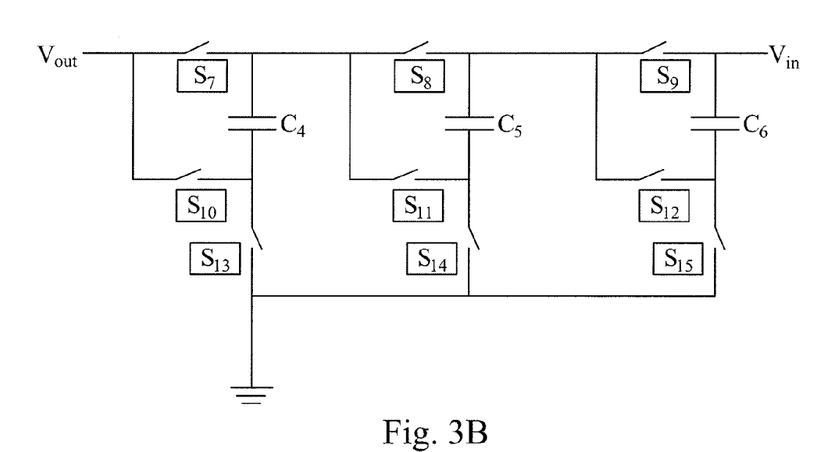
Figure 3C:
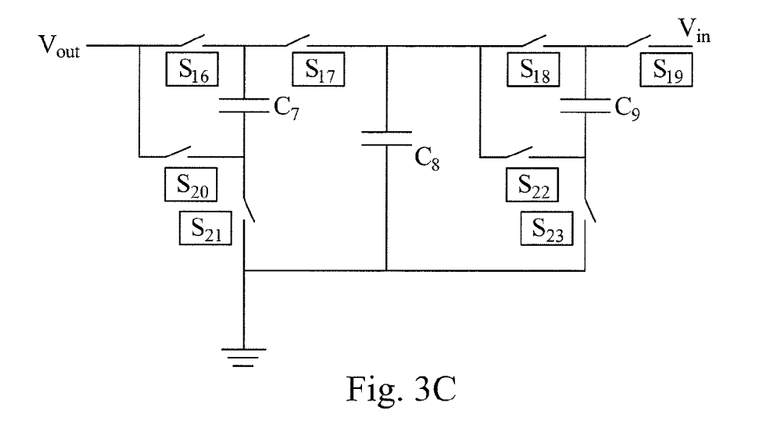
Figure 3D:
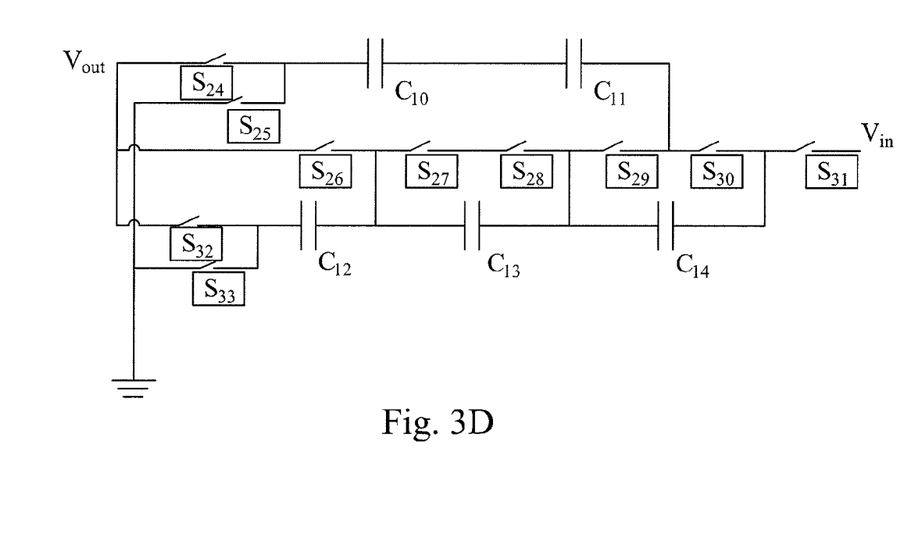
Figure 3E:
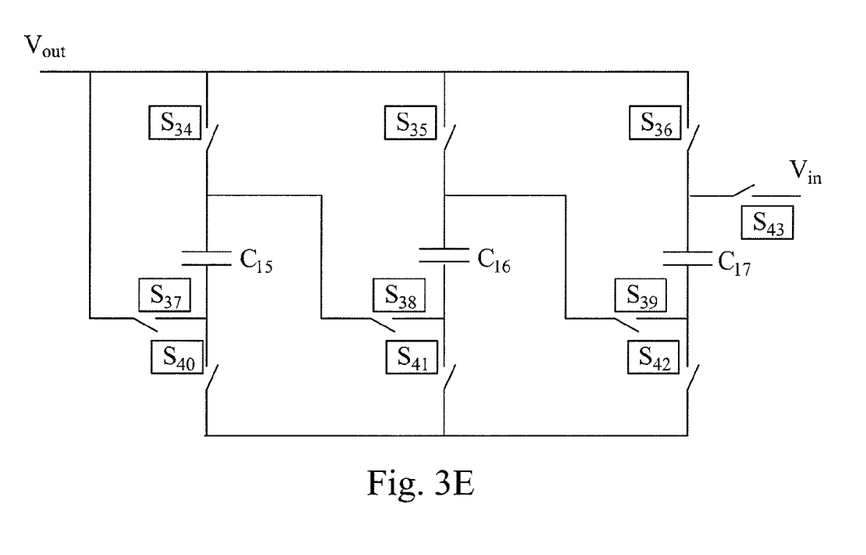

For example, the package system 100 includes a DC/DC converter. The active circuitry 120 includes one or more switches that are operable to electrically couple one or more of the passive electrical components 110 to each other. FIGS. 3A-3E are schematic drawing of various types of exemplary DC/DC converters. In FIG. 3A, the active circuitry 120 includes switches $S_1$-$S_6$ and the passive electrical components 110 includes capacitors $C_1$-$C_3$. In FIG. 3B, the active circuitry 120 includes switches $S_7$-$S_{15}$ and the passive electrical components 110 includes capacitors $C_4$-$C_6$. In FIG. 3C, the active circuitry 120 includes switches $S_{16}$-$S_{23}$ and the passive electrical components 110 includes capacitors $C_7$-$C_9$. In FIG. 3D, the active circuitry 120 includes switches $S_{24}$-$S_{33}$ and the passive electrical components 110 includes capacitors $C_{10}$-$C_{14}$. In FIG. 3E, the active circuitry 120 includes switches $S_{34}$-$S_{43}$ and the passive electrical components 110 includes capacitors $C_{15}$-$C_{17}$.

In some embodiments, the capacitors $C_1$-$C_{17}$ each have a capacitance ranging from about 100 nanofarad (nF) to about 5 micro farad (µF). By using one of the various DC/DC converters shown in FIGS. 3A-3E, an input voltage ($V_{in}$), e.g., 3.6 V from a battery can be regulated down to an output voltage ($V_{out}$) of about 1 V that is supplied to the active circuitry 120. In some embodiments, the capacitors $C_1$-$C_{17}$ each are a surface-mount device (SMD) capacitor. It is noted that the various types of the DC/DC converters described above in conjunction with FIGS. 3A-3E are merely exemplary. In some embodiments, the passive electrical components 110 and the active circuitry 120 are arranged to form different DC/DC converters. In other embodiments, one or more inductors are used in place of one or more of the capacitors $C_1$-$C_{17}$ to regulate the battery.

Figure 3F:
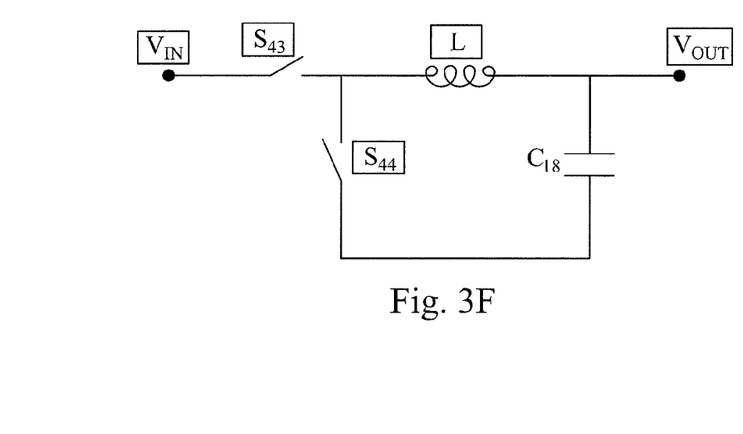
FIG. 3F is a schematic drawing of an exemplary inductive switch regulator.

In some embodiments, the package system 100 includes an inductive switch regulator as shown in FIG. 3F. The active circuitry 120 includes switches $S_{43}$ and $S_{44}$ that are operable to electrically couple one or more of a capacitor $C_{18}$ and an inductor L to each other. It is noted that the DC/DC converters and the inductive switch regulator described above in conjunction with FIGS. 3A-3F are merely exemplary. The scope of the application is not limited thereto. In some embodiments, the package system 100 includes at least one of a boost switch regulator, a buck converter, other types of regulators or converters, other circuitries that include passive electrical components, and/or any combinations thereof.

In some embodiments, the substrate 101 is made of an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate has a gradient SiGe feature in which the Si and Ge composition change from one ratio at one location to another ratio at another location of the gradient SiGe feature. In another embodiment, the alloy SiGe is formed over a silicon substrate. In yet another embodiment, a SiGe substrate is strained. In some embodiments, the semiconductor substrate has a semiconductor on insulator structure, such as a silicon on insulator (SOI) structure. In some examples, the semiconductor substrate includes a doped epi layer or a buried layer. In other examples, the compound semiconductor substrate has a multilayer structure, or the substrate includes a multilayer compound semiconductor structure.

Referring to FIG. 2A, an interconnect structure 130 is disposed over the active circuitry 120. In some embodiments, the interconnect structure 130 includes at least one dielectric layer and at least one electrical connection structure (not shown). For example, the interconnect structure 130 includes multiple dielectric layers and multiple layers of electrical connection structures. The electrical connection structures each are between two dielectric layers. The electrical connection structures are configured to provide electrical connection among transistors, diodes, devices, circuitries, and/or other electrical components of the active circuitry 120. In some embodiments, the dielectric layers and the conductive structures are arranged to form various passive devices, e.g., capacitors, resistors, and/or inductors.

In some embodiments, the dielectric layers include at least one material, such as silicon oxide, silicon nitride, silicon oxynitride, low dielectric constant (low-k) dielectric material, ultra low-k dielectric material, other dielectric materials, and/or any combinations thereof. The electrical connection structures include at least one structure, such as via plugs, contact plugs, damascene structures, dual damascene structures, metallic regions, metallic lines, metallic slats, other electrical connection structures, and/or any combinations thereof. In some embodiments, the via plugs, contact plugs, damascene structures, dual damascene structures, metallic regions, metallic lines, and metallic slats are made of at least one material, such as tungsten, aluminum, copper, titanium, tantalum, titanium nitride, tantalum nitride, nickel silicide, cobalt silicide, other proper conductive materials, and/or combinations thereof.

Referring again to FIG. 2A, a passivation structure 150 is disposed over the active circuitry 120. The passivation structure 150 has at least one opening, e.g., openings 151a-151d configured to expose at least one electrical pad, e.g., electrical pads 140a-140d, respectively. In some embodiments, the electrical pads 140a-140d are electrically coupled with the active circuitry 120 through the interconnect structure 130.

In some embodiments, the electrical pads 140a-140d are made of at least one material, such as copper (Cu), aluminum (Al), aluminum copper (AlCu), aluminum silicon copper (AlSiCu), tungsten, aluminum, copper, titanium, tantalum, titanium nitride, tantalum nitride, nickel silicide, cobalt silicide, other conductive materials, and/or any combinations thereof. In some embodiments, the electrical pads 140a-140d each include an under bump metallization (UBM) layer (not shown).

In some embodiments, the passivation structure 150 includes at least one dielectric layer and/or at least one polymer layer. The dielectric layer can include a material such as oxide, nitride, oxynitride, other dielectric materials, and/or any combinations thereof. The polymer layer can include a material such as thermoplastic, thermoset, elastomer, coordination polymer, other suitable polymers, and/or any combinations thereof. In some embodiments, the passivation structure 150 is a single layer structure. In other embodiments, the passivation structure 150 is a multi-layer structure.

Referring to FIG. 2A, the passive electrical components 110a and 110b are disposed over the passivation structure 150. In some embodiments, an adhesive material, e.g., epoxy (not shown) is disposed between the respective passive electrical components 110a and 110b and the passivation structure 150. The adhesive material is applied to facilitate the physical connection between the passive electrical components 110a and 110b and the passivation structure 150.

Referring again to FIG. 2A, the passive electrical components 110a and 110b are electrically coupled with the respective electrical pads 140a-140d. For example, the passive electrical component 110a is electrically coupled with the electrical pads 140a and 140b through wires 161a and 161b, respectively. The passive electrical component 110b is electrically coupled with the electrical pads 140c and 140d through wires 161c and 161d, respectively. In some embodiments, the wires 161a and 161b are electrically coupled with opposite nodes of the passive electrical component 110a, and the wires 161c and 161d are electrically coupled with opposite nodes of the passive electrical component 110b. In some embodiments, the wires 161a-161d are made of at least one material such as gold, copper, aluminum, tin, silver, lead, other metallic materials, and/or any combinations thereof.

Referring to FIG. 2A, the package system 100 can be disposed over a printed circuit board (PCB). As noted, the passive electrical components 110a and 110b are disposed over the passivation structure 150. The passive electrical components 110a and 110b do not consume any space of the PCB, such that more space on the PCB can be available to accommodate other circuitries. Little or no footprint of the passive electrical components 110a and 110b is left on the PCB.

As the passive electrical components 110a and 110b are disposed over the passivation structure 150 and electrically coupled with the active circuitry 120 through the electrical pads 140a-140d, the electrical communication speed between the passive electrical components 110a and 110b and the active circuitry 120 is increased. In some embodiments, the passive electrical components 110a and 110b are SMD capacitors which are cheaper than discrete inductors that were used and disposed on a PCB. In contrast, in accordance with one or more of the embodiments, the cost of manufacturing discrete inductors disposed on a PCB is expensive and the discrete inductors occupy a large area of the circuit board, which can minimize the space available to accommodate other circuitries or to reduce the size of the package system 100. The cost of manufacturing the package system 100 can be desirably reduced.

Figure 2B:
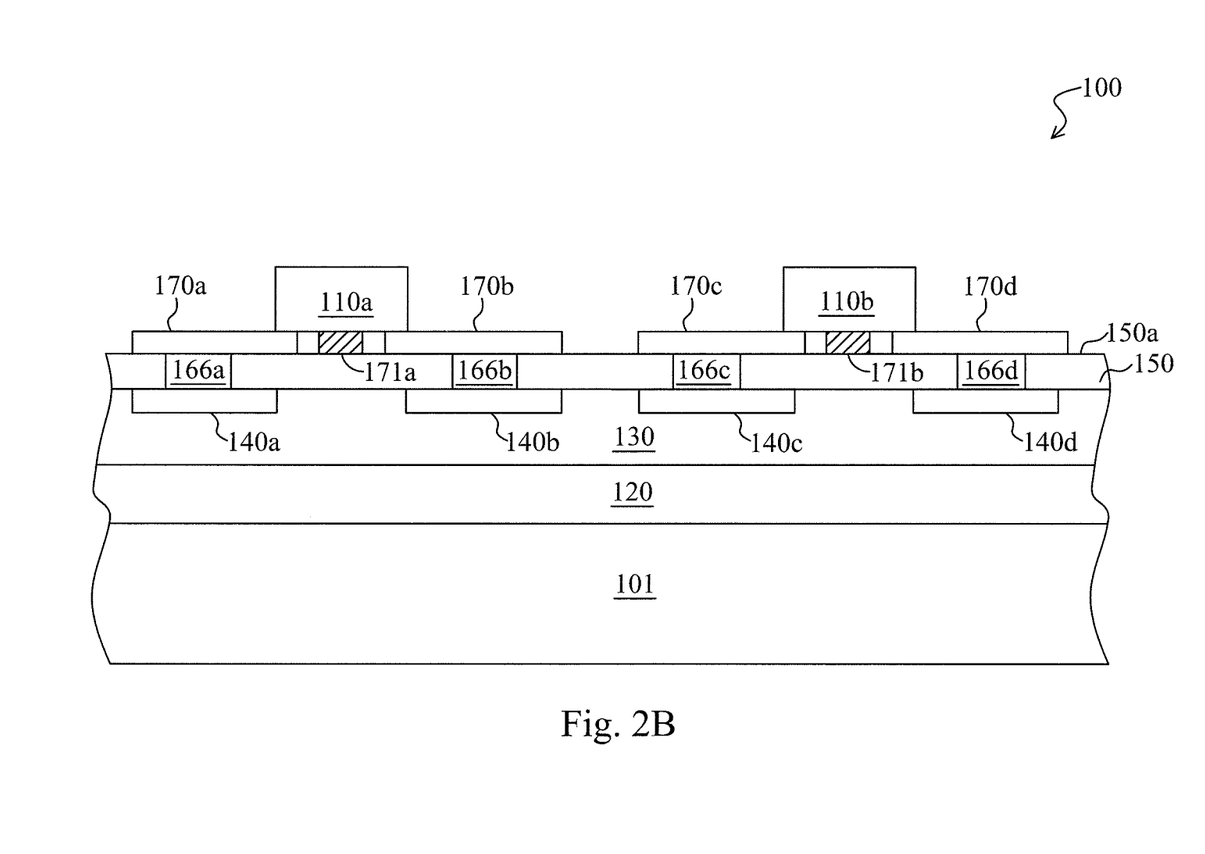

FIG. 2B is a schematic cross-sectional view of a second exemplary package system taken along section line A-A of FIG. 1. Items of the package system 100 in FIG. 2B that are the same or similar items of the package system 100 in FIG. 2A are indicated by the same reference numerals. In FIG. 2B, the package system 100 includes electrical connection structures 166a-166d disposed in the respective openings of the passivation structure 150. In some embodiments, the electrical connection structures 166a-166d each are a via plug, a contact plug, a damascene structure, a dual damascene structure, a metallic region, a metallic line, a metallic slat, or one of other electrical connection structures. In some embodiments, the via plugs, contact plugs, damascene structures, dual damascene structures, metallic regions, metallic lines, and metallic slats are made of at least one material, such as tungsten, aluminum, copper, titanium, tantalum, titanium nitride, tantalum nitride, nickel silicide, cobalt silicide, other proper conductive materials, and/or any combinations thereof.

Referring to FIG. 2B, at least one electrical pad, e.g., electrical pads 170a-170d are disposed over and electrically coupled with the electrical connection structures 166a-166d, respectively. The electrical pads 170a-170d are separated from each other. In some embodiments, the electrical pads 170a-170d are made of at least one material such as copper (Cu), aluminum (Al), aluminum copper (AlCu), aluminum silicon copper (AlSiCu), tungsten, titanium, tantalum, titanium nitride, tantalum nitride, nickel silicide, cobalt silicide, other conductive materials, and/or any combinations thereof.

Referring again to FIG. 2B, the passive electrical component 110a is disposed over and electrically coupled with the electrical pads 170a and 170b. The passive electrical component 110b is disposed over and electrically coupled with the electrical pads 170c and 170d. In some embodiments, the electrical pads 170a and 170b are electrically coupled with opposite nodes of the passive electrical component 110a, and the electrical pads 170c and 170d are electrically coupled with opposite nodes of the passive electrical component 110b.

In some embodiments, adhesive materials 171a and 171b are optionally disposed between the passive electrical component 110a and the passivation structure 150 and between the passive electrical component 110b and the passivation structure 150, respectively. The adhesive material 171a is disposed between and separated from the electrical pads 170a and 170b. The adhesive material 171b is disposed between and separated from the electrical pads 170c and 170d. In some embodiments, the adhesive materials 171a and 171b can include a material such as a thermosetting resin to facilitate connection between the passive electrical components 110a and 110b and the passivation structure 150.

It is noted that the configuration of the electrical connection structures 166a-166d, the electrical pads 170a-170d, the adhesive materials 171a and 171b, and/or the passive electrical components 110a and 110b described above in conjunction with FIG. 2B is merely exemplary. The scope of this application is not limited thereto. In some embodiments, the electrical connection structures 166a-166d continuously extend over a surface 150a of the passivation structure 150.

Figure 2C:
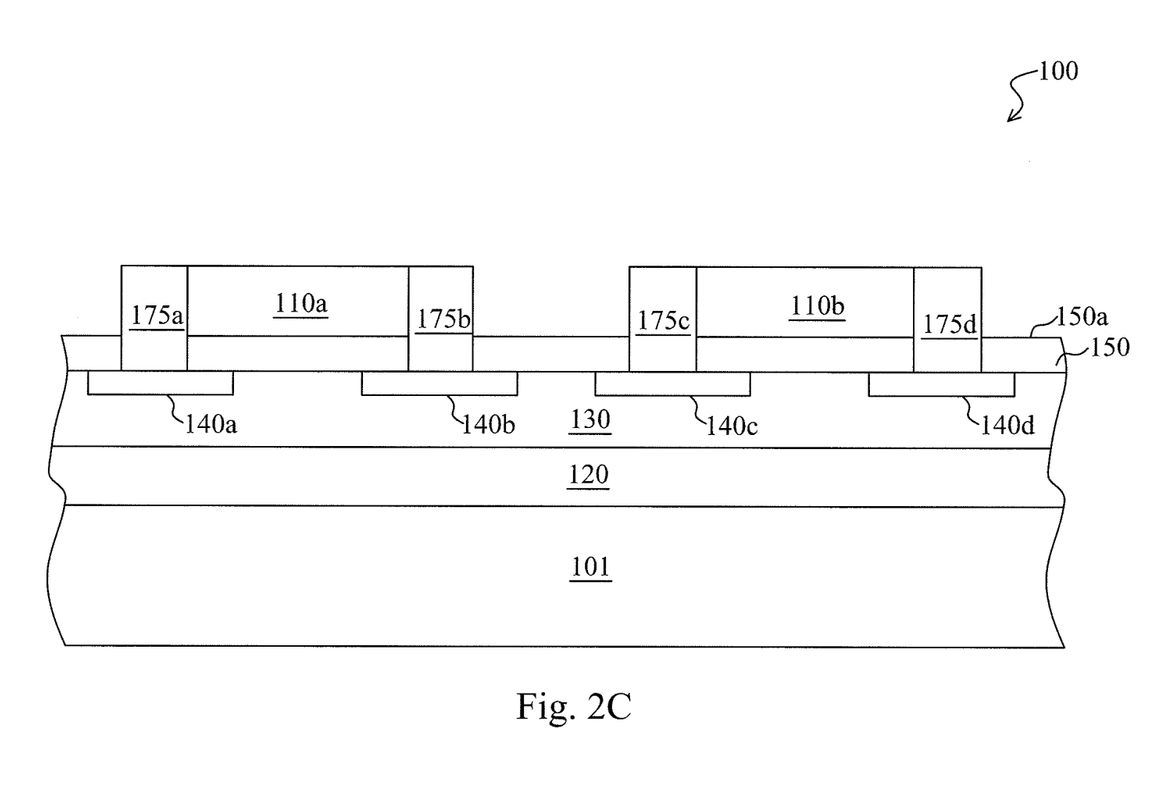

FIG. 2C is a schematic cross-sectional view of a third exemplary package system taken along section line A-A of FIG. 1. Items of the package system 100 in FIG. 2C that are the same or similar items of the package system 100 in FIG. 2A are indicated by the same reference numerals. In FIG. 2C, the package system 100 includes electrical connection structures 175a-175d disposed in the respective openings of the passivation structure 150 and continuously extend above the surface 150a of the passivation structure 150. In some embodiments, the electrical connection structures 175a-175d each are a via plug, a contact plug, a damascene structure, a dual damascene structure, a metallic region, a metallic line, a metallic slat, or one of other electrical connection structures. In some embodiments, the via plugs, contact plugs, damascene structures, dual damascene structures, metallic regions, metallic lines, and metallic slats are made of at least one material, such as tungsten, aluminum, copper, titanium, tantalum, titanium nitride, tantalum nitride, nickel silicide, cobalt silicide, other proper conductive materials, and/or any combinations thereof.

Referring to FIG. 2C, the passive electrical component 110a is disposed between and electrically coupled with the electrical connection structures 175a and 175b. The passive electrical component 110b is disposed between and electrically coupled with the electrical connection structures 175c and 175d. In some embodiments, the electrical connection structures 175a and 175b are electrically coupled with opposite nodes of the passive electrical component 110a, and the electrical connection structures 175c and 175d are electrically coupled with opposite nodes of the passive electrical component 110b.

In some embodiments, the top surface of the passive electrical component 110a is substantially leveled with the top surfaces of the electrical connection structures 175a and 175b. In other embodiments, the top surface of the passive electrical component 110a is higher or lower than the top surfaces of the electrical connection structures 175a and 175b.

It is noted that though the package system 100 of FIGS. 2A-2B shows that the passive electrical components 110a and 110b are disposed directly on or over the passivation structure 150, the scope of this application is not limited thereto. In some embodiments, other dielectric layers and/or materials are disposed between the passive electrical components 110a and 110b and the passivation structure 150. In other embodiments, at least one interposer and/or additional die is disposed between the passive electrical components 110a and 110b and the passivation structure 150. In still other embodiments, at least one interposer and/or additional die is disposed over the passive electrical components 110a and 110b.

In a first embodiment of the application, a package system includes at least one active circuitry disposed over a substrate. A passivation structure is disposed over the at least one active circuitry. The passivation structure has at least one opening that is configured to expose at least one first electrical pad. At least one passive electrical component is disposed over the passivation structure. The at least one passive electrical component is electrically coupled with the at least one first electrical pad.

In a second embodiment of this application, a package system includes at least one active circuitry disposed over a substrate. A passivation structure is disposed over the at least one active circuitry. The passivation structure has a first opening exposing a first electrical pad and a second opening exposing a second electrical pad. A first electrical connection structure and a second electrical connection structure are disposed in the first and second openings, respectively. A first surface-mount device (SMD) capacitor is disposed over the passivation structure. The first SMD capacitor is electrically coupled with the first and second electrical pads through the first and second electrical connection structures, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package system comprising:
   at least one active circuitry disposed over a substrate;
   a passivation structure disposed over the at least one active circuitry, the passivation structure having at least one opening that is configured to expose at least one first electrical pad, the at least one first electrical pad electrically coupled with the at least one active circuitry;
   at least one passive electrical component disposed over the passivation structure, the at least one passive electrical component being electrically coupled with the at least one first electrical pad; and
   a plurality of electrical connection structures configured to electrically couple the at least one passive electrical component with the at least one first electrical pad, wherein at least one electrical connection structure of the plurality of electrical connection structures extends beyond an outer sidewall surface of the at least one passive electrical component, and the at least one passive electrical component is between two electrical connection structures of the plurality of electrical connection structures.

2. The package system of claim 1, wherein the at least one passive electrical component is selected from the group consisting of a capacitor, an inductor, and a resistor.

3. The package system of claim 1, wherein the at least one electrical connection structure comprises at least one electrical wire electrically coupled between the at least one passive electrical component and the at least one first electrical pad.

4. The package system of claim 1, further comprising:
   at least one adhesive material disposed between the at least one passive electrical component and the passivation structure.

5. The package system of claim 1, wherein the at least one electrical connection structure is in the at least one opening of the passivation structure, the at least one electrical connection structure continuously extending over a surface of the passivation structure.

6. The package system of claim 1, wherein the at least one passive electrical component is arranged in an array fashion over the passivation structure.

7. The package system of claim 1, wherein the at least one passive electrical component includes a first set of passive electrical components and a second set of passive electrical components, the first set of passive electrical components are arranged in a series fashion, and the second set of passive electrical components are arranged in a parallel fashion.

8. A package system comprising:
   at least one active circuitry disposed over a substrate;
   a passivation structure disposed over the at least one active circuitry, the passivation structure having a first opening exposing a first electrical pad and a second opening exposing a second electrical pad, the first and second electrical pads electrically coupled with the at least one active circuitry;
   a first passive electrical component disposed over the passivation structure, wherein a first node of the first passive electrical component is electrically coupled with the first electrical pad and a second node of the first passive electrical component is electrically coupled with the second electrical pad; and
   a second passive electrical component disposed over the passivation structure and electrically coupled with the first passive electrical component.

9. The package system of claim 8,
   wherein the passivation structure has a third opening exposing a third electrical pad and a fourth opening exposing a fourth electrical pad, the third and fourth electrical pads electrically coupled with the at least one active circuitry,
   a first node of the second passive electrical component is electrically coupled with the third electrical pad, and a second node of the second passive electrical component is electrically coupled with the fourth electrical pad.

10. The package system of claim 8, wherein the first and second passive electrical components are electrically coupled to each other in a series or parallel fashion.

11. The package system of claim 8, wherein each of the first and second passive electrical components are selected from the group consisting of a capacitor, an inductor, and a resistor.

12. The package system of claim 8, further comprising:
    a first electrical wire electrically coupled between the first electrical pad and the first node; and
    a second electrical wire electrically coupled between the second electrical pad and the second node.

13. The package system of claim 8, further comprising:
    a first electrical connection structure disposed in the first opening and electrically coupled with the first electrical pad;
    a second electrical connection structure disposed in the second opening and electrically coupled with second electrical pad;
    a fifth electrical pad disposed over the first electrical connection structure and electrically coupled between the first electrical connection structure and the first node; and a sixth electrical pad disposed over the second electrical connection structure and electrically coupled between the second electrical connection structure and the second node.

14. The package system of claim 13 further comprising:
at least one adhesive material disposed between the first passive electrical component and the passivation structure.

15. The package system of claim 9 further comprising:
a first electrical connection structure disposed in the first opening, wherein the first electrical connection structure continuously extends over a surface of the passivation structure and is electrically coupled between the first electrical pad and the first node; and
a second electrical connection structure disposed in the second opening, wherein the second electrical connection structure continuously extends over the surface of the passivation structure and is electrically coupled between the second electrical pad and the second node.

16. A package system comprising:
at least one active circuitry disposed over a substrate;
a passivation structure disposed over the at least one active circuitry, the passivation structure having a first opening exposing a first electrical pad and a second opening exposing a second electrical pad, the first and second electrical pads electrically coupled with the at least one active circuitry;
a first electrical connection structure and a second electrical connection structure disposed in the first and second openings, respectively, wherein the first and second electrical connection structures are completely within the passivation structure;
a first surface-mount device (SMD) capacitor disposed over the passivation structure, wherein the first SMD capacitor is electrically coupled with the first and second electrical pads through the first and second electrical connection structures, respectively; and
an adhesive material between the first SMD capacitor and the passivation structure.

17. The package system of claim 16 further comprising:
a third electrical pad disposed over the first electrical connection structure and electrically coupled between the first electrical connection structure and the first SMD capacitor; and
a fourth electrical pad disposed over the second electrical connection structure and electrically coupled between the second electrical connection structure and the first SMD capacitor.

18. The package system of claim 16 further comprising:
a second SMD capacitor disposed over the passivation structure and electrically coupled with the first SMD capacitor in a series or parallel fashion, wherein the passivation structure has a third opening exposing a fifth electrical pad and a fourth opening exposing a sixth electrical pad, and the second SMD capacitor is electrically coupled with the fifth and sixth electrical pads.

19. The package system of claim 1, wherein the at least one electrical connection structure extends through the passivation structure beyond a bottom surface of the at least one passive electrical component in a direction perpendicular to a top surface of the substrate.

20. The package system of claim 4, wherein the at least one adhesive material is located between a first electrical connection structure of the plurality of electrical connection structures and a second electrical connection structure of the plurality of electrical connection structures.

* * * * *